(12) United States Patent
Wagner

(10) Patent No.: US 7,447,848 B2
(45) Date of Patent: Nov. 4, 2008

(54) MEMORY DEVICE ROW AND/OR COLUMN ACCESS EFFICIENCY

(76) Inventor: Barry Wagner, 6062 Montoro Rd., San Jose, CA (US) 95120

( * ) Notice: Subject to any disclaimer, the term of this patent is extended or adjusted under 35 U.S.C. 154(b) by 272 days.

(21) Appl. No.: 11/326,157

(22) Filed: Jan. 4, 2006

(65) Prior Publication Data

US 2007/0156979 A1    Jul. 5, 2007

(51) Int. Cl.
*G06F 13/28* (2006.01)
(52) U.S. Cl. .................. 711/154; 711/100; 711/105; 711/157

(58) Field of Classification Search ............... 711/1, 711/2, 5, 6, 100, 104, 105, 154, 157
See application file for complete search history.

(56) References Cited

U.S. PATENT DOCUMENTS

| 6,853,382 | B1 | 2/2005 | Van Dyke |
| 6,999,088 | B1 | 2/2006 | Van Dyke |
| 2002/0093870 | A1* | 7/2002 | Noda et al. ............ 365/230.06 |
| 2003/0182513 | A1* | 9/2003 | Dodd et al. ................. 711/137 |

\* cited by examiner

*Primary Examiner*—Tuan V. Thai
(74) *Attorney, Agent, or Firm*—Berkeley Law and Technology Group, LLP

(57) ABSTRACT

Embodiments for retrieving data from memory devices using sub-partitioned addresses are disclosed.

19 Claims, 8 Drawing Sheets

MEMORY DEVICE ROW AND/OR COLUMN ACCESS EFFICIENCY

BACKGROUND

This disclosure is related to memory devices within computing platforms.

Computing platforms typically include one or more dynamic random access memory (DRAM) devices. DRAM devices may be used in a variety of contexts, including main system memory and/or graphics memory, to list a couple of examples. For some computing platforms, one or more DRAM devices may be coupled to a graphics processing unit (GPU). The GPU may be located on a motherboard for some platforms, and for other platforms the GPU may be located on an adapter card.

For some computing platforms, a GPU may be coupled to one or more x16 or x32 DRAM devices. The term "x16" denotes a memory device having a 16 bit data interface and the term "x32" denotes a memory device having a 32 bit data interface. Typically, the DRAM devices have a multiplexed address bus in which a row address is sent from a memory controller located in the GPU to the DRAM and then one or more cycles later a column address is sent to the DRAM. At least in part in response to the row and column addresses, the DRAM device may retrieve data from an array of storage locations and place the data on a data bus for delivery to the GPU. For some computing platforms, the GPU may have a 64 bit data bus. For the cases where x16 DRAM devices are used for graphics memory, 4 DRAM devices may be coupled to the GPU. For cases where x32 DRAM devices are used, 2 DRAM devices may be coupled to the GPU.

DRAM devices may output data in a burst fashion. Some DRAM devices may burst groups of 4 or 8 data bits for each data output line per column address. In order to increase overall memory subsystem performance, burst lengths may increase. As burst lengths increase, the column access granularity increases which may result in a memory controller taking more data than it needs from the DRAM. For some GPUs, a sub-partition scheme may be implemented to help improve efficiency. Such a sub-partition scheme may send unique address bits to each DRAM for a subset of the total address width. For example, the total number of address inputs for a DRAM may be 13. For the case where two x32 DRAM devices are used, in order to provide a unique address to each DRAM device, 26 address lines would be required. If a 4 bit sub-partition scheme is implemented, the total number of address signals output by the memory controller increases from 13 to 17.

FIG. 1 depicts an example sub-partition scheme. A memory subsystem 100, perhaps a graphics memory subsystem, includes a memory controller 110. Memory controller 110 for this example is coupled to memory devices 120 and 130. For this example, memory devices 120 and 130 comprise x32 DRAM devices. A data bus 111 is coupled between memory controller 110 and memory devices 120 and 130. For this example, data bus 111 comprises data lines capable of delivering 64 bit s of data at a time. For this example, an address bus 121 provides 9 address lines to both memory device 120 and memory device 130. A 4 bit sub-partition address bus 123 is coupled to memory device 130, and a separate 4 bit sub-partition address bus 125 is coupled to memory device 120. For this example, memory controller 110 may deliver a row address to memory devices 120 and 130 using address bus 121 and sub-partition address busses 123 and 125. For this example, sub-partition address busses 123 and 125 have identical row address information. Also for this example, memory controller 110 may deliver column address information to memory devices 120 and 130. For this example, sub-partition address busses 123 and 125 have different column address information, allowing memory controller 110 to individually address different columns in memory devices 120 and 130. The ability to deliver sub-partitioned column addresses to the memory devices may result in improvements in efficiency. However, as x64 or greater DRAM devices become more common, the prior sub-partition schemes become inoperable because the full 64 bits of data for this example may be delivered by a single DRAM device. The prior sub-partitioning schemes require multiple DRAM devices per interface.

BRIEF DESCRIPTION OF THE DRAWINGS

Subject matter is particularly pointed out and distinctly claimed in the concluding portion of the specification. Claimed subject matter, however, both as to organization and method of operation, together with objects, features, and advantages thereof, may best be understood by reference of the following detailed description if read with the accompanying drawings in which:

DETAILED DESCRIPTION

Figure 1:
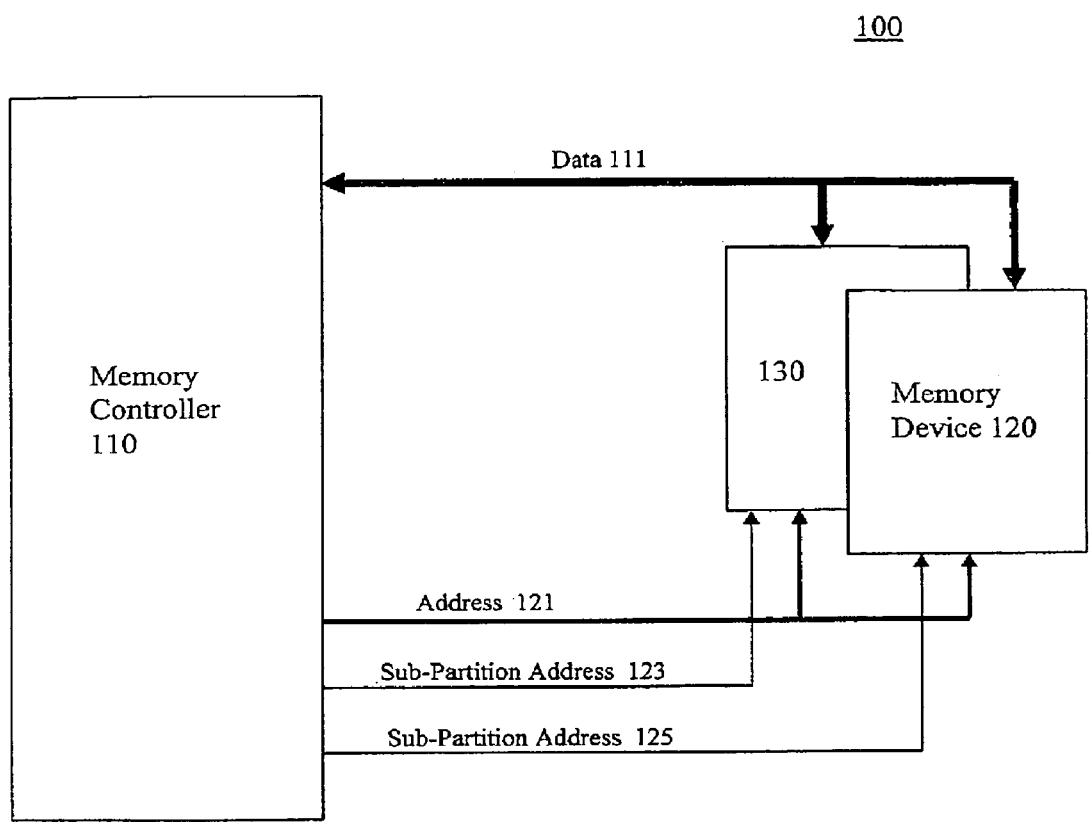
FIG. 1 is a block diagram of an example memory subsystem incorporating a sub-partition scheme using a plurality of memory devices.

In the following detailed description, numerous specific details are set forth to provide a thorough understanding of claimed subject matter. However, it will be understood by those skilled in the art that claimed subject matter may be practiced without these specific details. In other instances, well-known methods, procedures, components and/or circuits have not been described in detail so as not to obscure claimed subject matter.

Reference throughout this specification to "one embodiment" or "an embodiment" means that a particular feature, structure, or characteristic described in connection with the embodiment is included in at least one embodiment of claimed subject matter. Thus, the appearances of the phrase "in one embodiment" and/or "an embodiment" in various places throughout this specification are not necessarily all referring to the same embodiment. Furthermore, the particular features, structures, and/or characteristics may be combined in one or more embodiments.

"Logic" as referred to herein relates to structure for performing one or more logical operations. For example, logic may comprise circuitry which provides one or more output signals based at least in part on one or more input signals. Such circuitry may comprise a finite state machine which receives a digital input signal and provides a digital output signal, or circuitry which provides one or more analog output signals in response to one or more analog input signals. Such circuitry may be provided, for example, in an application specific integrated circuit (ASIC) and/or a field programmable gate array (FPGA). Also, logic may comprise machine-readable instructions stored in a storage medium in combination with a processor or other processing circuitry to execute such machine-readable instructions. However, these are merely examples of structures which may provide logic and claimed subject matter is not limited in these respects.

Unless specifically stated otherwise, as apparent from the following discussion, it is appreciated that throughout this specification discussions utilizing terms such as "processing," "computing," "calculating," "selecting," "forming," "enabling," "inhibiting," "identifying," "initiating," "querying," "obtaining ," "hosting," "maintaining," "representing," "modifying," "receiving," "transmitting," "storing," "determining" and/or the like refer to the actions and/or processes that may be performed by a computing platform, such as a computer or a similar electronic computing device, that manipulates and/or transforms data represented as physical, electronic and/or magnetic quantities and/or other physical quantities within the computing platform's processors, memories, registers, and/or other information storage, transmission, reception and/or display devices. Accordingly, a computing platform refers to a system or a device that includes the ability to process and/or store data in the form of signals. Thus, a computing platform, in this context, may comprise hardware, software, firmware and/or any combination thereof. Further, unless specifically stated otherwise, a process as described herein, with reference to flow diagrams or otherwise, may also be executed and/or controlled, in whole or in part, by a computing platform.

In the following description and/or claims, the terms coupled and/or connected, along with their derivatives, may be used. In particular embodiments, connected may be used to indicate that two or more elements are in direct physical and/or electrical contact with each other. Coupled may mean that two or more elements are in direct physical and/or electrical contact. However, coupled may also mean that two or more elements may not be in direct contact with each other, but yet may still cooperate and/or interact with each other.

Figure 2:
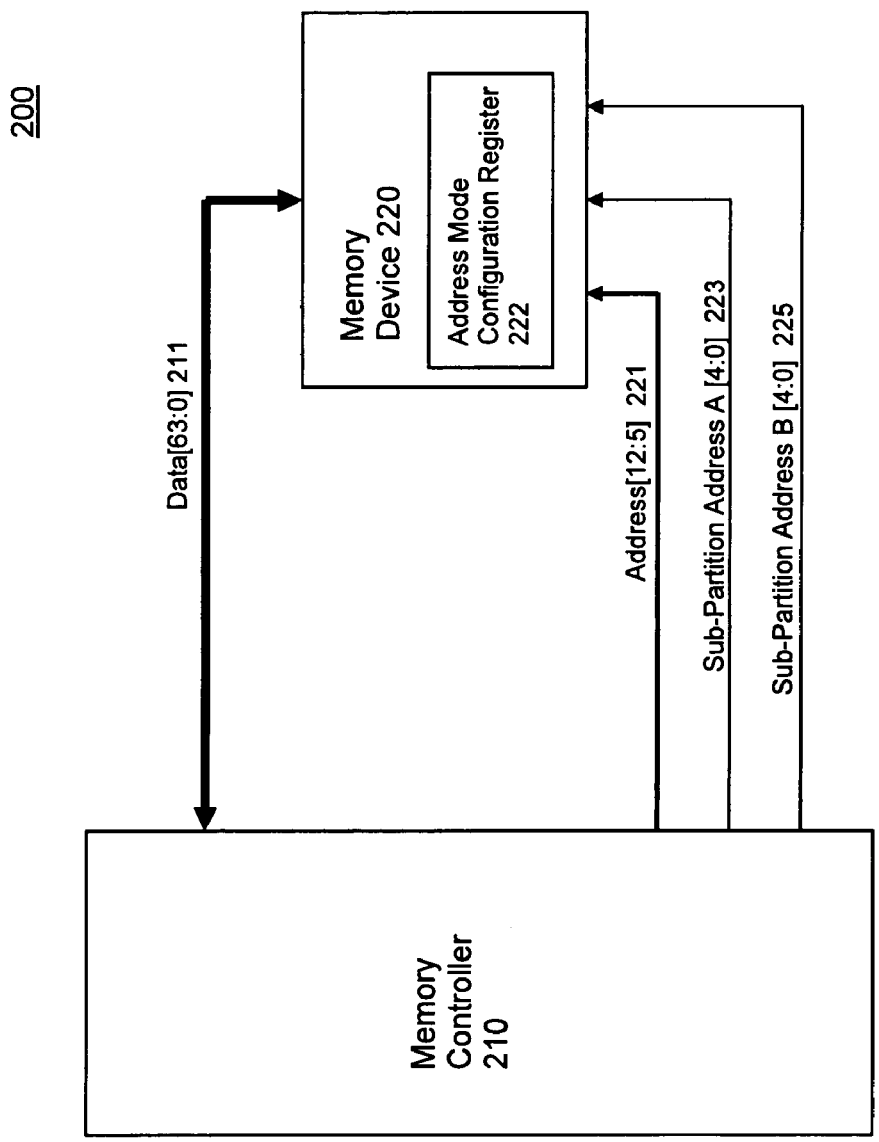
FIG. 2 is a block diagram of an example embodiment of a memory subsystem including an example embodiment of a memory device incorporating sub-partitioned addressing in accordance with one or more embodiments.

FIG. 2 is a block diagram of an example embodiment of a memory subsystem 200 including an example embodiment of a memory device 220 incorporating sub-partitioned addressing in accordance with one or more embodiments. For this example embodiment, memory device 220 comprises a x64 DRAM device, although the scope of the claimed subject matter is not limited in this respect. Also for this example, memory device 220 may comprise a double data rate (DDR) DRAM device, although, again, the scope of the claimed subject matter is not limited in this respect. Memory device 220 for this example is coupled to a memory controller 210 via a data bus 211. For this example, data bus 211 comprises 64 data lines, although the scope of the claimed subject matter is not limited in this respect. For one embodiment, data bus 211 may incorporate differential signaling technology. Other embodiments may incorporate single-ended signaling. For this example, an address bus 221 provides 8 address lines to memory device 220. A 5 bit sub-partition address A bus 223 and a separate 5 bit sub-partition address B bus 225 are also coupled to memory device 220. For this example, memory controller 210 may deliver a 13 bit row address to memory device 220 using address bus 221 and sub-partition address busses 223 and 225. For this example, sub-partition address busses 223 and 225 have identical row address information. Also for this example, memory controller 210 may deliver column address information to memory devices 220. For this example, sub-partition address busses 223 and 225 have different column address information from each other, allowing memory controller 110 to individually address different columns in memory device 220 concurrently. The ability to deliver multiple sub-partitioned column addresses to memory device 220 thereby providing an ability to access multiple storage locations concurrently may result in improvements in efficiency.

Also for example memory subsystem 200, memory device 220 may include an address mode configuration register 222. Register 222 may store information that may define various modes of operation related to sub-partition addressing. In one embodiment, a value may be stored in register 222 that turns off the sub-partition addressing feature. In this mode, one of the sub-partition address busses 223 or 225 may be disabled and all row and column addresses may be delivered from memory controller 210 to memory device 220 via a combination of address bus 221 and one of the sub-partition address busses. For one or more embodiments, sub-partitioning address modes and/or other modes or features may be enabled or disabled depending on voltage levels present at one or more input pins for a memory device.

Further, although the example embodiment depicted in FIG. 2 discloses sub-partitioned column addresses, other embodiments are possible that utilize sub-partitioning of row addresses. Sub-partitioned row addresses may be used in connection with sub-partitioned column addresses to access data stored at disparate locations within an array of storage locations concurrently. Sub-partitioning of row addresses is discussed further below in connection with FIG. 4.

Memory device 220 and/or memory controller 210 may be capable of transferring data in a burst manner. For this example embodiment, data retrieved in response at least in part to receiving column address information over sub-partition address A 223 may be output onto data bus 211 and subsequently data retrieved in response at least in part to receiving column address information over sub-partition address B 225 may be output onto data bus 211. In another embodiment, the data retrieved in response to sub-partition address A and the data retrieved in response to sub-partitioned address B may be interleaved. Further, the burst length may be variable and/or programmable. For this example, the burst length may have a value of 4, although the scope of the claimed subject matter is not limited in this respect.

Although memory device 220 is shown coupled to memory controller 210 via a data bus and an address bus, a wide variety of embodiments are possible that include a number of other signals including, but not limited to, bank address signals, data strobes, data mask signals, clock signals, various command signals, etc. Further, although the embodiments discussed herein disclose sub-partitioned addressing for memory read transactions, other embodiments may also implement sub-partitioned addressing for memory write transactions. Also, although memory device 220 is shown with specific numbers and/or configurations of address lines and sub-partitioned address lines, other embodiments are possible that vary from the number and/or configuration of address lines disclosed herein.

Further, although the example embodiments herein discuss the use of DDR DRAM devices, other embodiments are possible using other memory device types, for example DDR2 and/or DDR4 DRAM devices. Embodiments are possible using any memory device technology that allows for row and column addressing.

Figure 3:
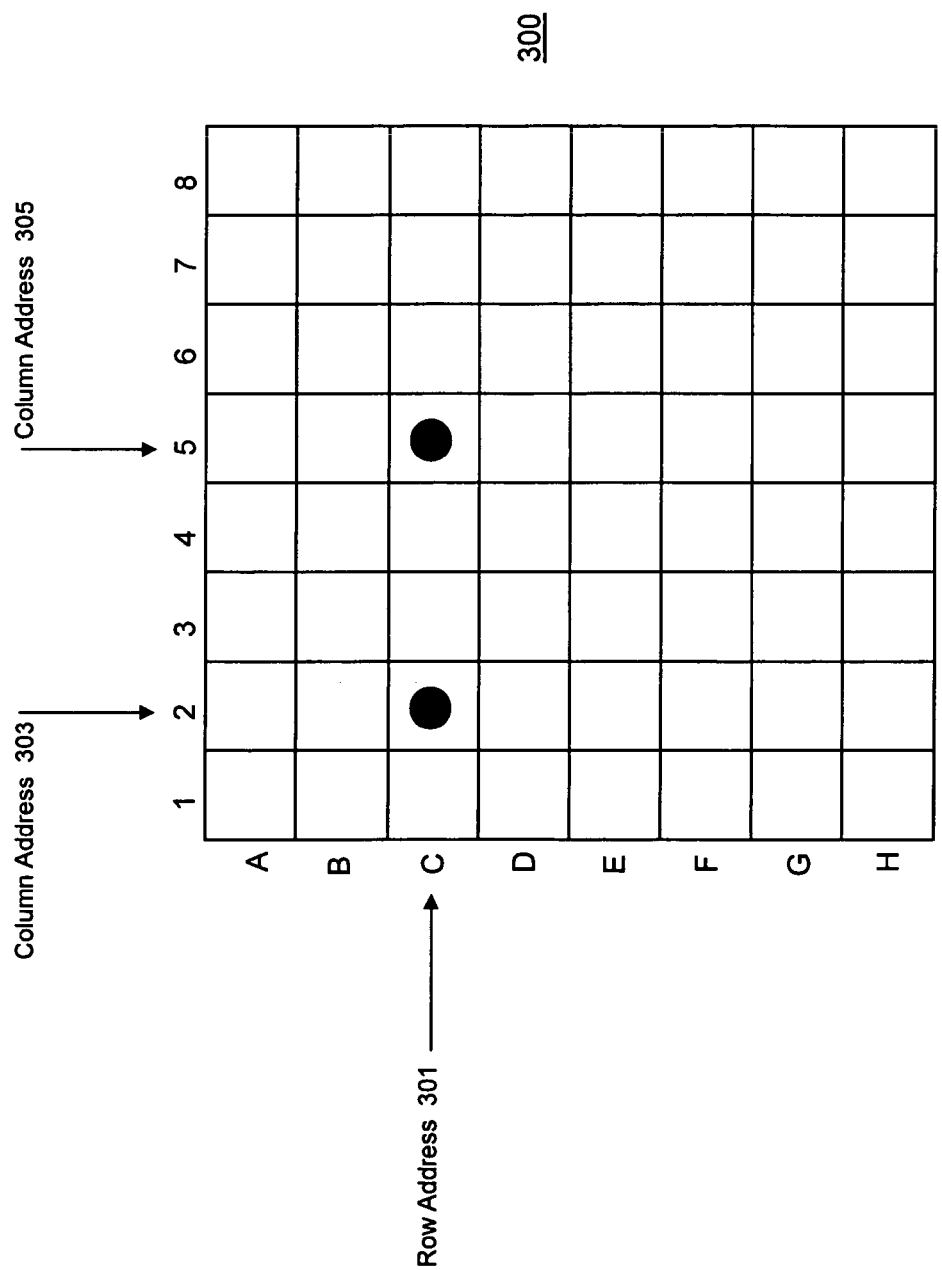
FIG. 3 depicts an array of storage locations addressed by a row address and a plurality of column addresses.

FIG. 3 depicts an array of storage locations 300 within a memory device addressed by a row address and a plurality of column addresses. The example array 300 includes 64 storage locations. Of course, in most embodiments much larger arrays may be used. For this example, assume that a memory controller, for example a controller such as controller 210, is requesting data stored in two separate locations within array 300. For this example, the desired data is stored at location C2 and location C5. A row address specifying row C may first be received. Then, two separate column addresses are received concurrently that specify columns 2 and 5. The two column addresses may share a number of lines in common, and may also have a number of address lines that differ from each other to provide the sub-partitioned addressing. As can be seen, the sub-partitioned column addresses provide a way for data to be retrieved concurrently from separate columns within the array.

Figure 4:
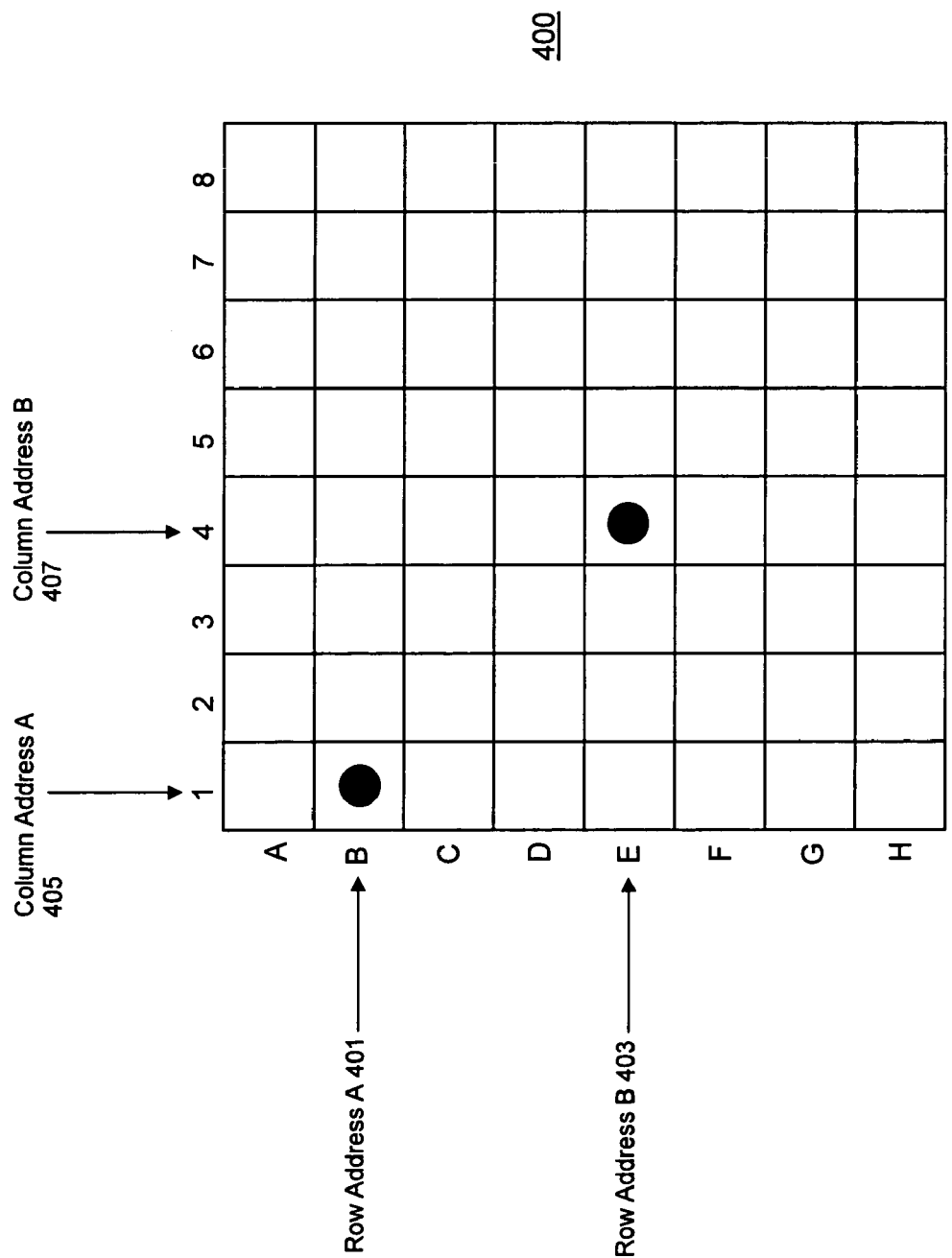
FIG. 4 depicts an array of storage locations addressed by a plurality of row addresses and a plurality of column addresses.

FIG. 4 depicts an array of storage locations 400 within a memory device addressed by a plurality of row addresses and a plurality of column addresses. The example array 400 includes 64 storage locations, although in most embodiments much larger arrays may be used. As for the previous example, for this example assume that a memory controller is requesting data stored at two separate locations within array 400. For this example, the desired data is stored at location B1 and at location E4. For this example, two sub-partitioned row addresses are received by the memory device specifying rows B and E. Subsequently, two sub-partitioned column addresses may be received that specify columns 1 and 4. As can be seen, the ability of the memory device to receive sub-partitioned row and/or column addresses provides a way for data to be retrieved concurrently from separate rows and/or columns within array 400.

Figure 5:
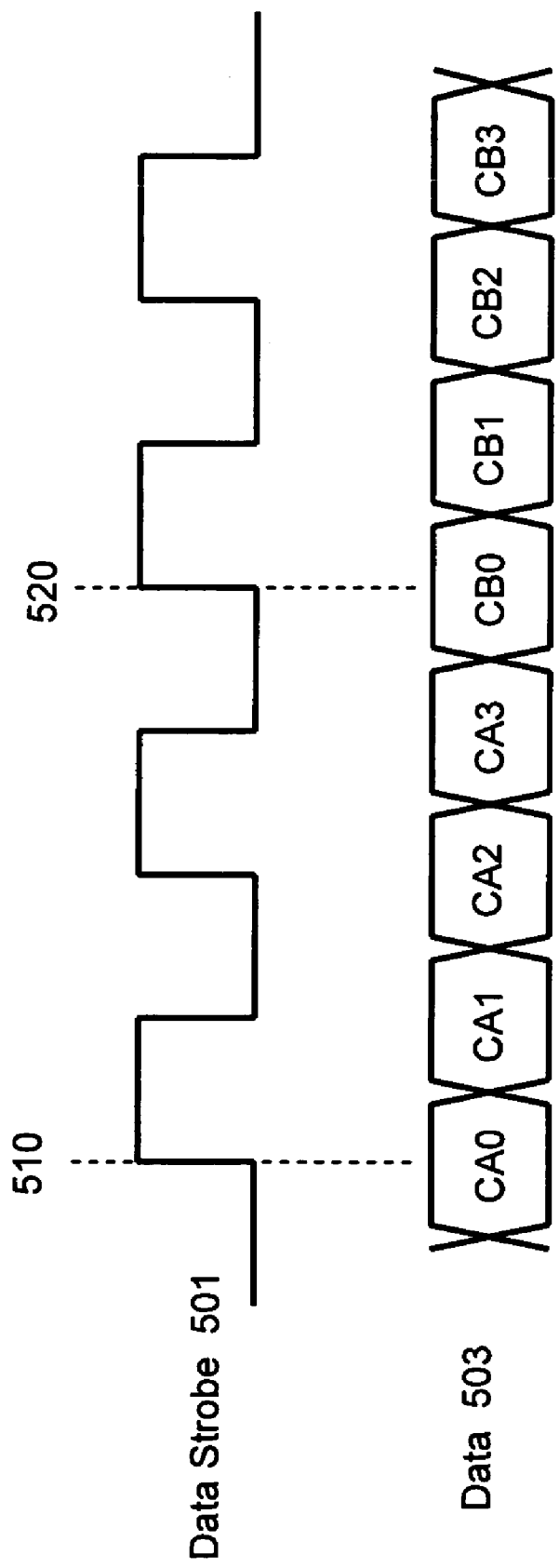
FIG. 5 is a timing diagram depicting an example data burst transaction.

FIG. 5 is a timing diagram depicting an example data burst transaction. For this example, data 503 is being output by a DDR DRAM device where the DDR device implements an embodiment for sub-partitioned column addressing. For this example, data 503 is output in conjunction with a data strobe signal 501. A memory controller may latch data 503 in response to both rising and falling edges of data strobe 510. For this example, data associated with a first sub-partitioned column address is output in a burst manner beginning at time 510. A burst length of 4 is used for this example, although the claimed subject matter is not limited in this respect. At time 520, data associated with a second sub-partitioned column address is output in a burst manner. However, this is merely an example of how data may be output by a memory device, and the scope of the claimed subject matter is not limited in these respects. Further, as previously discussed, the burst length and burst mode may be programmable.

Figure 6:
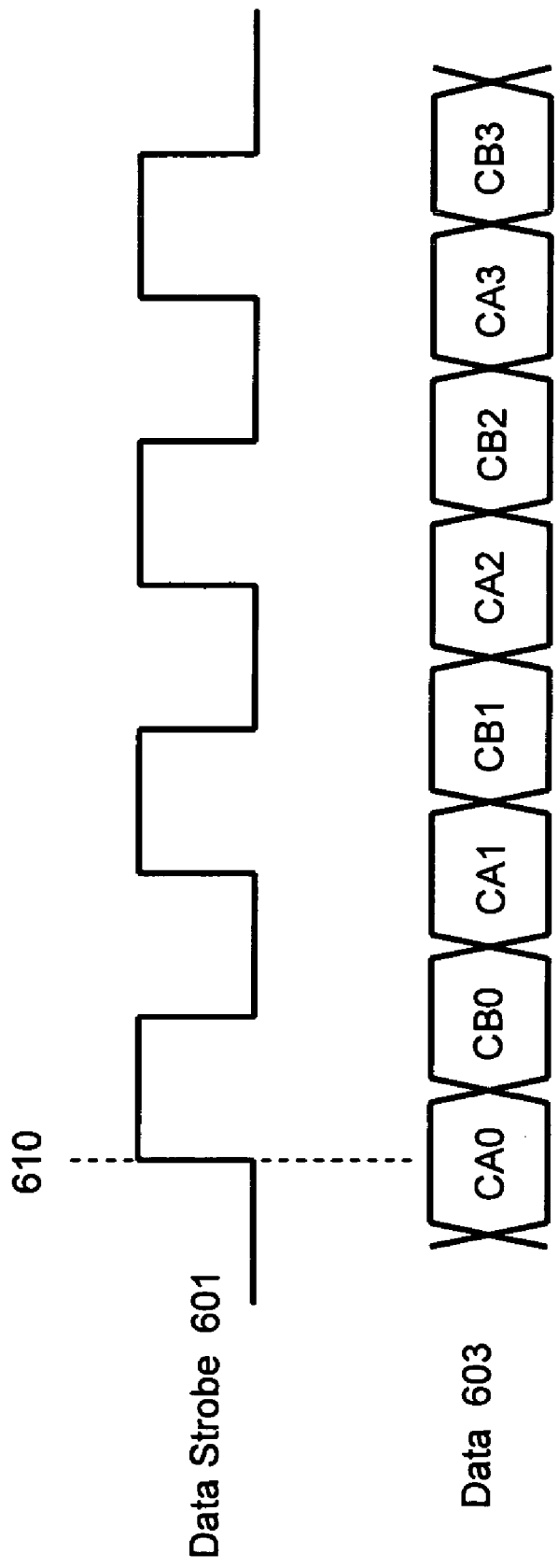
FIG. 6 is a timing diagram depicting an example interleaved data burst transaction.

FIG. 6 is a timing diagram depicting an example interleaved data burst transaction. For this example, data 603 is being output by a DDR DRAM device where the DDR device implements an embodiment for sub-partitioned column addressing. For this example, data 603 is output in conjunction with a data strobe signal 601. For this example, data associated with a first sub-partitioned column address and data associated with a second sub-partitioned column address are interleaved and output in a burst manner beginning at time 610. However, this is merely an example of how data may be output by a memory device, and the scope of the claimed subject matter is not limited in these respects.

Figure 7:
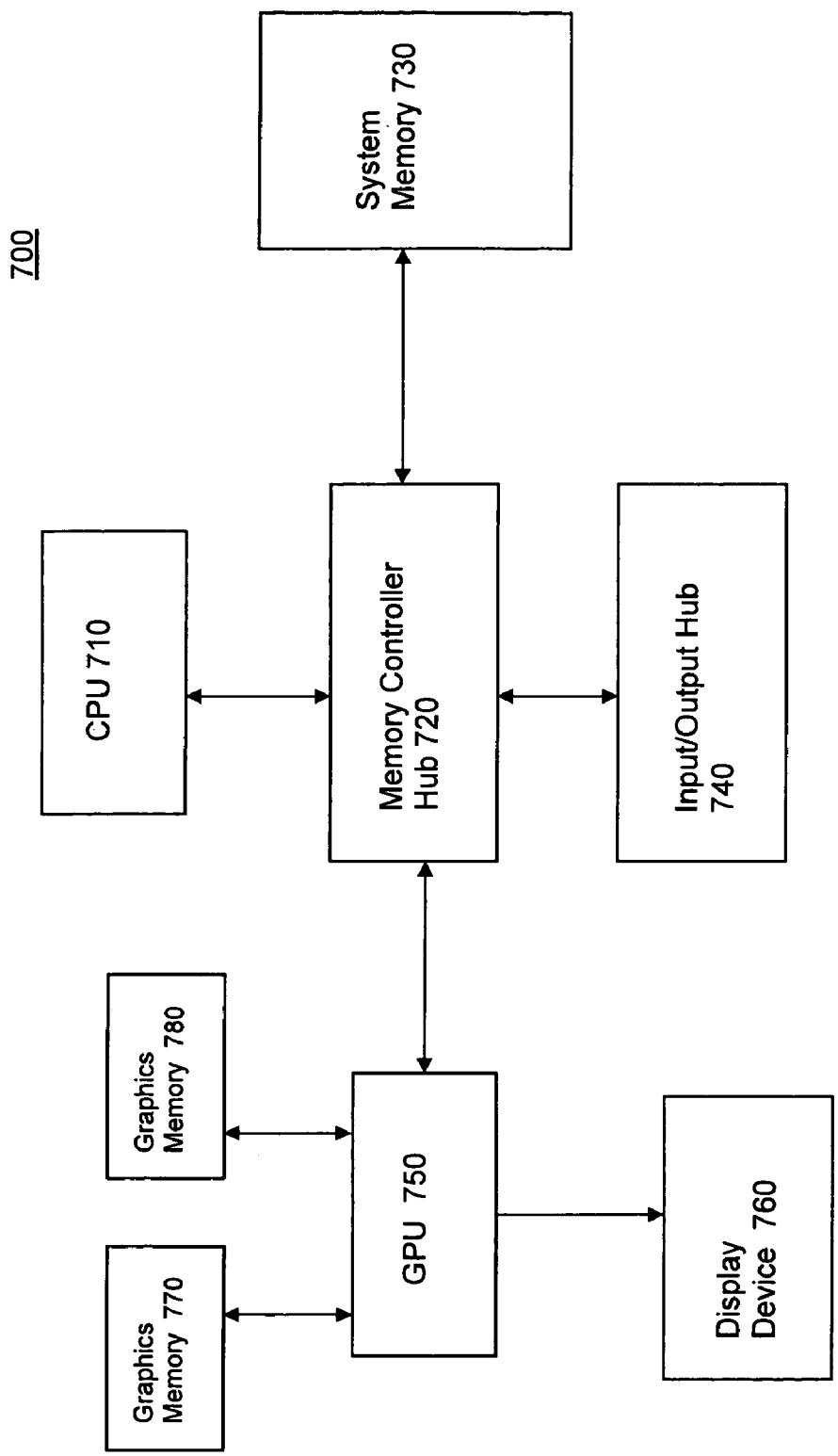
FIG. 7 is a block diagram of an example embodiment of a computing platform.

FIG. 7 is a block diagram of an example embodiment of a computing platform 700. Computing platform 700 includes a central processing unit (CPU) 710 and a memory controller hub 720 coupled to CPU 710. Memory controller hub 720 is further coupled to a system memory 730, to a GPU 750, and to an input/output hub 740. GPU 750 is further coupled to a display device 760, which may comprise a CRT display, a flat panel LCD display, or other type of display device.

For this example embodiment, GPU 710 is coupled to a graphics memory device 770 and a graphics device 780. Graphics memory devices 770 and/or 780 may be implemented in accordance with embodiments described above in connection with FIGS. 2-6. For this example, graphics memory devices 770 and 780 may comprise 64 bit memory devices, although the scope of the claimed subject matter is not limited in this respect. Further, graphics memory devices 770 and 780 may be coupled to separate memory controllers within GPU 750. Also, for an embodiment system memory 730 may comprise one or more memory devices implemented in accordance with embodiments described above in connection with FIGS. 2-6, although the scope of the claimed subject matter is not limited in this respect.

Although example system 700 is shown with a particular configuration of components, other embodiments are possible using any of a wide range of configurations. Further, the example embodiments described herein may be utilized in any of a wide range of electronic devices, including, but not limited to, computing platforms, gaming devices, cellular phones, personal digital assistants, music players, communications network components, etc.

Figure 8:
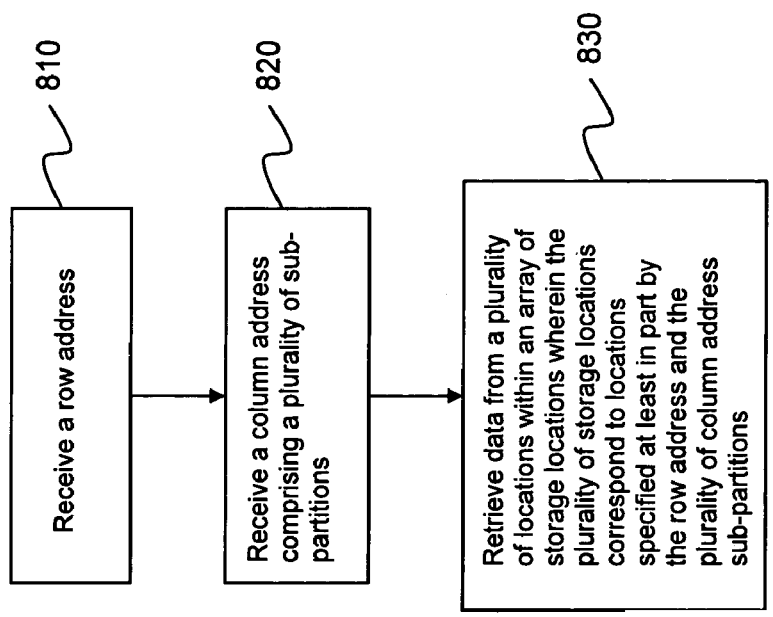
FIG. 8 is a flow diagram of an example embodiment of a method for accessing data from an array of storage locations using sub-partitioned addressing.

FIG. 8 is a flow diagram of an example embodiment of a method for retrieving data from a plurality of locations within an array of storage locations using sub-partitioned addressing. At block 810, a row address may be received. At block 820, a column address comprising a plurality of sub-partitions may be received. At block 830, data may be retrieved from a plurality of locations within an array of storage locations wherein the plurality of storage locations correspond to locations specified at least in part by the row address and by the plurality of column address sub-partitions. An embodiment in accordance with claimed subject matter may include all, more than all or less than all of blocks 810-830. Furthermore, the order of blocks 810-830 is merely one example order, and scope of the claimed subject matter is not limited in this respect.

In the preceding description, various aspects of claimed subject matter have been described. For purposes of explanation, systems and configurations were set forth to provide a thorough understanding of claimed subject matter. However, it should be apparent to one skilled in the art having the benefit of this disclosure that claimed subject matter may be practiced without the specific details. In other instances, well-known features were omitted and/or simplified so as not to obscure claimed subject matter. While certain features have been illustrated and/or described herein, many modifications, substitutions, changes and/or equivalents will now occur to those skilled in the art. It is, therefore, to be understood that the appended claims are intended to cover all such modifications and/or changes as fall within the true spirit of claimed subject matter.

The invention claimed is:

1. A memory device, comprising:
   an array of storage locations;
   a single address interface adapted to receive a row address and a column address wherein the column address comprises a plurality of sub-partitions; and
   a single data output interface adapted to output data retrieved concurrently from a plurality of locations within the array of storage locations, wherein the plurality of locations within the array correspond to locations specified at least in part by the row address and the plurality of column address sub-partitions.

2. The memory device of claim 1, wherein the row address comprises a plurality of sub-partitions.

3. The memory device of claim 1, wherein the data retrieved from the plurality of locations within the array is output in a burst manner.

4. The memory device of claim 1, wherein data retrieved from a first location of the plurality of locations within the array is interleaved with data retrieved from a second location of the plurality of locations with the array, and further wherein the interleaved data is output in a burst manner.

5. The memory device of claim 1, wherein the data output interface comprises a 64 bit data output interface.

6. The memory device of claim 1, wherein the memory device comprises a double data rate random access memory.

7. The memory device of claim 1, further comprising an address mode configuration register.

8. A system, comprising:
a memory controller; and
a memory device coupled to the memory controller, the memory device comprising
an array of storage locations,
a single address interface adapted to receive a row address and a column address wherein the column address comprises a plurality of sub-partitions; and
a single data output interface adapted to output data retrieved concurrently from a plurality of locations within the array of storage locations to the memory controller, wherein the plurality of locations within the array correspond to locations specified at least in part by the row address and the plurality of column address sub-partitions.

9. The system of claim 8, wherein the memory controller is comprised by a graphics processing unit.

10. The system of claim 8, wherein the row address comprises a plurality of sub-partitions.

11. The system of claim 8, wherein the data retrieved from the plurality of locations within the array is output in a burst manner to the memory controller.

12. The system of claim 8, wherein data retrieved from a first location of the plurality of locations within the array is interleaved with data retrieved from a second location of the plurality of locations with the array, and further wherein the interleaved data is output in a burst manner to the memory controller.

13. The system of claim 8, wherein the data output interface comprises a 64 bit data output interface.

14. The system of claim 8, wherein the memory device comprises a double data rate random access memory.

15. The system of claim 8, wherein the memory device further comprises an address mode configuration register.

16. A method, comprising:
receiving a row address at a single address interface;
receiving a column address at the single address interface wherein the column address comprises a plurality of sub-partitions; and
retrieving data concurrently from a plurality of locations within an array of storage locations, wherein the plurality of locations correspond to locations specified at least is part by the row address and the plurality of column address sub-partitions.

17. The method of claim 16, wherein receiving the row address comprises receiving a row address comprising a plurality of sub-partitions.

18. The method of claim 16, further comprising outputting the data retrieved from the plurality of locations in a burst manner.

19. The method of claim 16, further comprising:
interleaving data retrieved from a first location of the plurality of locations with data retrieved from a second location of the plurality of locations; and
outputting the interleaved data is output in a burst manner.

* * * * *